United States Patent
Araki et al.

(10) Patent No.: US 6,989,226 B2
(45) Date of Patent: Jan. 24, 2006

(54) WATER-DEVELOPABLE PHOTOSENSITIVE RESIN FOR FLEXOGRAPHY

(75) Inventors: Yoshifumi Araki, Fuji (JP); Hiromi Kobayashi, Yokohama (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 88 days.

(21) Appl. No.: 10/432,930

(22) PCT Filed: Nov. 27, 2001

(86) PCT No.: PCT/JP01/10336

§ 371 (c)(1),
(2), (4) Date: May 28, 2003

(87) PCT Pub. No.: WO02/44813

PCT Pub. Date: Jun. 6, 2002

(65) Prior Publication Data

US 2004/0067442 A1    Apr. 8, 2004

(30) Foreign Application Priority Data

Nov. 28, 2000 (JP) .................... 2000-361371
Apr. 10, 2001 (JP) .................... 2001-111193

(51) Int. Cl.
*G03F 7/033* (2006.01)

(52) U.S. Cl. .............. 430/287.1; 430/286.1; 430/285.1; 430/910; 522/110

(58) Field of Classification Search ........... 522/110; 430/306, 281.1, 286.1, 287.1

See application file for complete search history.

(56) References Cited

U.S. PATENT DOCUMENTS

| 4,927,738 A | * | 5/1990 | Iwanaga et al. ......... 430/286.1 |
| 4,996,134 A | * | 2/1991 | Enyo et al. .............. 430/286.1 |
| 5,348,844 A | | 9/1994 | Garmong |
| 5,731,129 A | | 3/1998 | Koshimura et al. |

FOREIGN PATENT DOCUMENTS

| JP | 52-134655 A | 11/1977 |
| JP | 53-137704 A | 12/1978 |
| JP | 5-5106 B2 | 1/1993 |
| JP | 7-114180 A | 5/1995 |

(Continued)

OTHER PUBLICATIONS

"Alkyl", Dictionary.com/alkyl, 3 pages, Copyright 2004, Lexico Publishing Group, LLC.*

(Continued)

*Primary Examiner*—Cynthia Hamilton
(74) *Attorney, Agent, or Firm*—Birch, Stewart, Kolasch & Birch, LLP

(57) ABSTRACT

An object of the present invention is to provide a photosensitive resin composition which is excellent in the compatibility (dispersibility) of photosensitive resin composition components, developability with aqueous developer solution, water resistance, image reproducibility, print wear characteristics in printing with a water base ink and plate wiping-off resistance in removal of ink adhered to any printing plate. The present invention relates to a photosensitive resin composition comprising a hydrophilic copolymer (A) obtained by copolymerizing at least (1) 2 to 15 parts by mass of an unsaturated monomer having a carboxyl group, (2) 50 to 80 parts by mass of a conjugated diene-type monomer, (3) 3 to 20 parts by mass of an aromatic vinyl compound, and (4) 3 to 30 parts by mass of an alkyl (meth)acrylate.

8 Claims, 1 Drawing Sheet

FOREIGN PATENT DOCUMENTS

| | | |
|---|---|---|
| JP | 8-160618 A | 6/1996 |
| JP | 9-40728 A | 2/1997 |
| JP | 63-8648 A | 1/1998 |
| JP | 10-148931 A | 6/1998 |
| JP | 10-287817 A | 10/1998 |
| JP | 2001-512180 A | 8/2001 |

OTHER PUBLICATIONS

Nippon Paint Co LTD, English machine translation of JP 10-148931 cited by applicants, from Patent Abstracts of Japan, date o reference translated, Jun. 2, 1998, 17 pages with abstract.*

* cited by examiner

WATER-DEVELOPABLE PHOTOSENSITIVE RESIN FOR FLEXOGRAPHY

TECHNICAL FIELD

The present invention relates to a photosensitive resin composition for printing plates which can be developed with an aqueous developer solution.

BACKGROUND ART

Common photosensitive resin printing plates which can be processed by an aqueous developer solution generally consist of a structure comprising: a support layer for maintaining dimensional precision; a layer of photosensitive resin composition comprising a mixture of a hydrophilic copolymer, a hydrophobic resin such as a thermoplastic elastomer, a photopolymerizable unsaturated monomer, a photopolymerization initiator, etc. on the support layer; and further thereon a thin flexible film layer, known as a slip layer or a protective layer, and a thin layer which can be ablated by an infrared laser.

With respect to a method of producing a printing plate from the above structure, a relief for printing is formed, when a flexible film layer is provided, by sticking a negative film thereonto, irradiating the structure with active rays through the negative film so as to selectively photo-cure specific areas of the photosensitive resin composition layer whereby an image is formed, and thereafter removing unexposed areas of the photosensitive resin composition layer with an aqueous developer solution (development).

With respect to such a photosensitive resin composition for flexographic printing, it is preferred from the viewpoint of faithfully obtaining needed images that individual components in the composition are finely and uniformly dispersed. Further, for shortening the time required for preparing a printing plate, it is preferred to increase the rate of development of the photosensitive resin composition. The photosensitive resin composition has to have satisfactory developability in an aqueous developer solution as above, but also, when made into a printing plate, high print wear characteristics of printing plate when used with an aqueous ink and also rupture resistance of the printing plate when the ink adhering to the printing plate after printing is wiped off with water or the like (plate wiping-off resistance). That is, the printing plate is required to have high water resistance and a high plate wiping-off resistance.

Various photosensitive resins which can be developed in an aqueous developer solution have been proposed in conformity with intended uses. JP-A-7-114180 proposes a photosensitive resin composition comprising a hydrophilic copolymer wherein phosphoric ester groups are contained as an essential component. An object of the invention described therein is to provide a resin composition which can be processed in an aqueous developer solution, which has photosensitivity, transparency and workability, and which can be cured into a cured product with excellent transparency and low-temperature elasticity. However, because of the use of phosphoric ester groups as an essential component of hydrophilic groups of the hydrophilic copolymer, its water resistance, plate wiping-off resistance and print wear characteristics of the printing plate from the resin composition are not necessarily satisfactory. In Comparative Example 2C of the laid-open reference, methacrylic acid is used in place of the phosphoric ester. However, the amount of methacrylic acid used is so large that its water resistance and print wear characteristics of the printing plate from the resin composition are not satisfactory.

U.S. Pat. No. 5,731,129 proposes a photosensitive resin composition comprising a hydrophilic copolymer wherein an unsaturated monomer having a carboxyl group and a conjugated diene monomer are contained as essential components while an aromatic vinyl compound and an alkyl (meth)acrylate are contained as optional components. An object of this invention is to suppress the swelling, strength drop and dimensional change by water, at the time of developing in an aqueous developer solution. However, because all of an unsaturated monomer having a carboxyl group, a conjugated diene monomer, an aromatic vinyl compound and an alkyl (meth)acrylate are not simultaneously employed in the monomers for the polymerization of the hydrophilic copolymer, the compatibility of the resin composition, developability with an aqueous developer solution and the print wear characteristics of printing resultant plates are not necessarily satisfactory.

JP-A-63-8648 proposes a photosensitive resin composition comprising hydrophilic copolymer particles crosslinked by a polyfunctional vinyl compound. An object of this invention is to suppress deteriorations of curing efficiency and relief image reproducibility by light, by using a hydrophobic resin as a matrix component and hydrophilic resin particles that have chemically and optically approximate compositions to each other. However, because a conjugated diene is not used as a monomer in the polymerization of the hydrophilic copolymer, the water resistance and print wear characteristics of the printing plate are not satisfactory. Further, because of the use of a polyvinyl compound in high proportion, satisfactory print wear characteristics cannot be attained.

JP-B-5-5106 proposes a photosensitive resin composition comprising a hydrophilic polymeric compound having carboxyl groups. An object of this invention is to suppress a decrease in resistance to a water or an alcohol base ink by using the above hydrophilic polymeric compound and a hydrophobic copolymer as a polymer component. However, because all of an unsaturated monomer having a carboxyl group, a conjugated diene-type monomer, an aromatic vinyl compound and an alkyl (meth)acrylate are not simultaneously employed in the monomers for use in the polymerization of the hydrophilic copolymer, the compatibility and developability with aqueous developer solution of resin composition and the print wear characteristics of resultant printing plates are not necessarily satisfactory.

U.S. Pat. No. 5,348,844 proposes a photosensitive resin composition comprising a hydrophilic copolymer wherein an unsaturated monomer having a carboxyl group, a conjugated diene-type monomer and a polyfunctional vinyl compound are contained as the essential components while an aromatic vinyl compound and an alkyl (meth)acrylate are contained as optional components. An object of this invention is to suppress deteriorations of elasticity, print wear characteristics and relief image reproducibility. However, because all of an unsaturated monomer having a carboxyl group, a conjugated diene-type monomer, an aromatic vinyl compound and an alkyl (meth)acrylate are not simultaneously employed, the compatibility and developability with aqueous developer solution of resin composition and the print wear characteristics of resultant printing plates are not necessarily satisfactory.

JP-A-2001-512180 proposes a photosensitive resin composition comprising a hydrophilic copolymer from ethylenically unsaturated monomers including a surfactant monomer. It is described therein that a hydrophilic polymer can be produced without employing a hydrophilic monomer as an essential raw material and by a one-stage polymerization process. However, because all of an unsaturated monomer having a carboxyl group, a conjugated diene monomer, an aromatic vinyl compound and an alkyl (meth)acrylate are not simultaneously employed in the monomers for use in the production of the hydrophilic copolymer, the water resistance and print wear characteristics of the printing plate from the resin composition are not necessarily satisfactory.

As apparent from the above, the conventional photosensitive resin compositions which can be developed with an aqueous developer solution, because of being mixtures of a hydrophilic component and a hydrophobic component as mentioned above, have posed such problems that the mutual compatibility (dispersibility) thereof is questionable, that the developability with aqueous developer solution of resin composition is low, that the printing plate prepared therefrom through exposure exhibits low print wear characteristics, low water resistance or low plate wiping-off resistance.

The technological problem to be solved in the present invention is, with a view toward solving the above problems, to provide a photosensitive resin composition which can simultaneously satisfy the following six requirements:

1) the mutual compatibility (dispersibility) of components in the photosensitive resin is high;
2) the developing time with an aqueous developer solution is short;
3) the image reproducibility of printing plate is high;
4) the water resistance of the printing plate is high;
5) the wear resistance (abrasion resistance) of the printing plate (especially upon using a water base ink) is high; and
6) the plate wiping-off resistance exhibited upon removing of the ink adhering to the printing plate is high.

SUMMARY OF THE INVENTION

The inventors have found that the above problem can be solved by the use of a hydrophilic polymer obtained by simultaneously employing at least (1) an unsaturated monomer having a carboxyl group, (2) a conjugated diene-type monomer, (3) an aromatic vinyl compound and (4) an alkyl (meth)acrylate at certain ratios. The present invention has been completed on the basis of this finding.

The first aspect of the present invention relates to a photosensitive resin composition for flexographic printing comprising:

(A) a hydrophilic copolymer,
(B) a thermoplastic elastomer,
(C) a photopolymerizable unsaturated monomer, and
(D) a photopolymerization initiator, wherein the hydrophilic copolymer (A) is a polymer obtained by copolymerizing at least:

(1) 2 to 15 parts by mass of an unsaturated monomer having a carboxyl group,
(2) 50 to 80 parts by mass of a conjugated diene-type monomer,
(3) 3 to 20 parts by mass of an aromatic vinyl compound, and
(4) 3 to 30 parts by mass of an alkyl (meth)acrylate, per 100 parts by mass of unsaturated monomers for use in the copolymerization.

The second aspect of the present invention relates to the photosensitive resin composition for flexographic printing according to the above first aspect of the present invention, wherein the hydrophilic copolymer (A) has a gel ratio, as measured with toluene, of 80 to 95%.

The third aspect of the present invention relates to the photosensitive resin composition for flexographic printing according to the above first or second aspect of the present invention, wherein the hydrophilic copolymer (A) is one synthesized by emulsion polymerization and the polymerization temperture is 60° C. or higher.

The fourth aspect of the present invention relates to the photosensitive resin composition for flexographic printing according to the above third aspect of the present invention, wherein the polymerization temperature is 70° C. or higher.

The fifth aspect of the present invention relates to the photosensitive resin composition for flexographic printing according to any one of the above first to fourth aspects of the present invention, wherein the hydrophilic copolymer (A) is a polymer obtained by copolymerizing at least:

(1) 2 to 15 parts by mass of the unsaturated monomer having a carboxyl group,
(2) 50 to 80 parts by mass of the conjugated diene-type monomer,
(3) 2 to 30 parts by mass of the aromatic vinyl compound, and
(4) 3 to 30 parts by mass of the alkyl (meth)acrylate, and further 0.5 part by mass or less of a polyfunctional vinyl compound, per 100 parts by mass of unsaturated monomers for use in the copolymerization.

The sixth aspect of the present invention relates to the photosensitive resin composition for flexographic according to the above first aspect of the present invention, wherein the hydrophilic copolymer (A) has a number average particle diameter ranging from 5 to 100 nm.

The seventh aspect of the present invention relates to the photosensitive resin composition for flexographic printing according to any one of the above first to sixth aspects of the present invention, wherein an emulsifier used in emulsion copolymerization of the hydrophilic copolymer (A) comprises a nonreactive emulsifier in an amount of less than 1 part by mass and a reactive emulsifier in an amount of 1 to 20 parts by mass, per 100 parts by mass of the hydrophilic copolymer.

The eighth aspect of the present invention relates to the photosensitive resin composition for flexographic printing according to the above seventh aspect of the present invention, wherein the reactive emulsifier contains a polyoxyalkylene structure.

The ninth aspect of the present invention relates to a photosensitive structure for flexographic printing, comprising a laminate structure comprising a support and a layer of the photosensitive resin composition according to any one of the above first to eighth aspects of the present invention formed on a surface of the support.

BEST MODE FOR CARRYING OUT THE INVENTION

Figure 1:
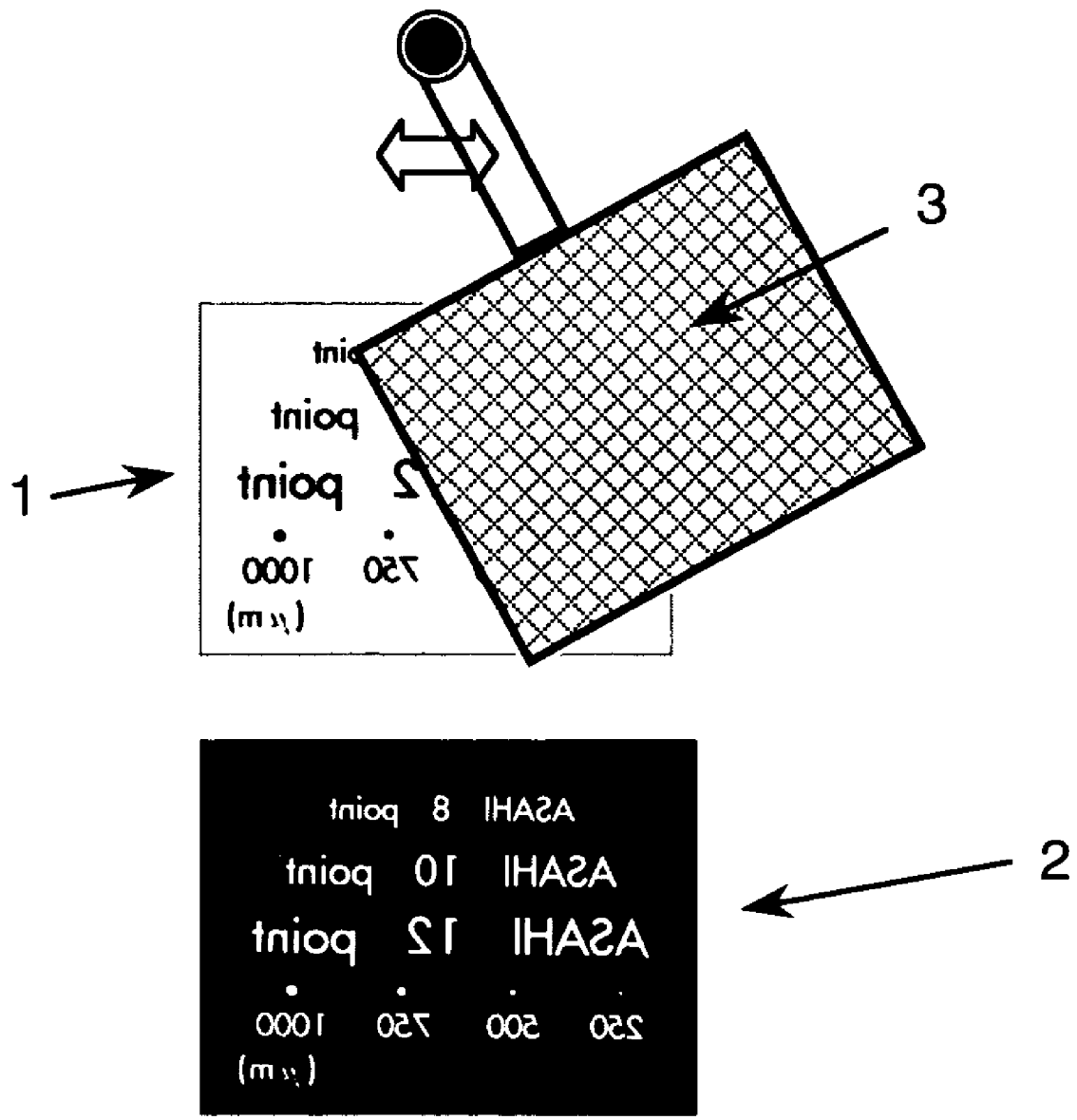
FIG. 1 is a view diagrammatically showing a test performed for evaluation of a printing plate wiping-off resistance.

The present invention will be described in detail hereinbelow.

As the unsaturated monomers having a carboxyl group (1), which is an essential component of the hydrophilic copolymer (A), for example, a monobasic acid monomer having a carboxyl group and a dibasic acid monomer having a carboxyl group are included.

More specifically, the monobasic acid monomer can be, for example, any of acrylic acid, methacrylic acid, crotonic acid, vinylbenzoic acid and cinnamic acid, as well as the sodium, potassium or ammonium salts thereof.

The dibasic acid monomer can be, for example, any of itaconic acid, fumaric acid, maleic acid, citraconic acid and muconic acid, as well as the sodium, potassium or ammonium salts thereof.

In the present invention, one or more unsaturated monomers having a carboxyl group can be used.

Among these, from the viewpoint of availability, the monobasic acid monomer is preferably acrylic acid or methacrylic acid, and the dibasic acid monomer is preferably itaconic acid or fumaric acid.

The unsaturated monomer having a carboxyl group (1) is used in an amount of 2 to 15 parts by mass per 100 parts by mass of unsaturated monomers for use in the polymerization of hydrophilic copolymer (A). When the amount is smaller than 15 parts by mass, excellent water resistance and workability can be attained. When the amount is larger than 2 parts by mass, satisfactory developability with aqueous developer solution can be attained. The amount is more preferably in the range of 2 to 10 parts by mass.

As the conjugated diene-type monomer (2), which is an essential component of the hydrophilic copolymer (A), for example, 1,3-butadiene, isoprene, 2,3-dimethyl-1,3-butadiene, 2-ethyl-1,3-butadiene, 2-methyl-1,3-butadiene, 1,3-pentadiene, chloroprene, 2-chloro-1,3-butadiene or cyclopentadiene are included.

In the present invention one or more conjugated diene monomers can be used.

Among these, from the viewpoint of availability, butadiene is preferred.

The conjugated diene (2) is used in an amount of 50 to 80 parts by mass per 100 parts by mass of unsaturated monomers for use in the polymerization of the hydrophilic copolymer (A). When the amount is smaller than 80 parts by mass, excellent processability can be attained. When the amount is larger than 50 parts by mass, deteriorations of water resistance and print wear characteristics can be avoided. The amount is preferably in the range of 60 to 80 parts by mass.

As the aromatic vinyl compound (3), which is an essential component of the hydrophilic copolymer (A), for example, styrene, α-methylstyrene, o-methylstyrene, m-methylstyrene, p-methylstyrene, ethylstyrene, vinylxylene, bromostyrene, vinylbenzyl chloride, p-t-butylstyrene, chlorostyrene and alkylstyrene are included.

In the present invention, one or more aromatic vinyl compounds can be used.

Among these, from the viewpoint of ease of polymerization, styrene is preferred.

The aromatic vinyl compound (3) is used in an amount of 3 to 20 parts by mass per 100 parts by mass of the unsaturated monomers for use in the polymerization of hydrophilic copolymer (A). When the amount is smaller than 20 parts by mass, satisfactory image reproducibility and developability with aqueous developer solutions can be attained. When the amount is larger than 3 parts by mass, the components of photosensitive resin composition can be dispersed in the mixture with satisfactory homogeneity. The amount is preferably in the range of 5 to 20 parts by mass.

The alkyl (meth)acrylate (4), which is an essential component of the hydrophilic copolymer (A), generally refers to an alkyl acrylate and an alkyl methacrylate, and includes, for example, methyl (meth)acrylate, ethyl (meth)acrylate, propyl (meth)acrylate, n-butyl (meth)acrylate, t-butyl (meth)acrylate, isobutyl (meth)acrylate, n-amyl (meth)acrylate, isoamylhexyl (meth)acrylate, octyl (meth)acrylate, nonyl (meth)acrylate, decyl (meth)acrylate, dodecyl (meth)acrylate, octadecyl (meth)acrylate, cyclohexyl (meth)acrylate, phenyl (meth)acrylate, benzyl (meth)acrylate, 2-ethylhexyl (meth)acrylate or hydroxylethyl (meth)acrylate.

In the present invention, one or more alkyl (meth)acrylates can be used.

Among these, from the viewpoint of easiness of synthesis, ethyl acrylate, butyl acrylate and 2-ethylhexyl acrylate are preferred.

The alkyl (meth)acrylate (4) is used in an amount of 3 to 30 parts by mass per 100 parts by mass of the unsaturated monomers for use in the polymerization of hydrophilic copolymer (A). When the amount is smaller than 30 parts by mass, excellent water resistance can be attained. When the amount is larger than 3 parts by mass, satisfactory developability with aqueous developer solutions can be attained. The amount is preferably in the range of 5 to 25 parts by mass.

In the hydrophilic copolymer (A), unsaturated monomers other than the above components (1) to (4) that can be used, for example, include a polyfunctional vinyl compound, ethylenic monocarboxylic acid alkyl ester monomers having a hydroxyl group, unsaturated dibasic acid alkyl esters, maleic anhydride, vinyl cyanide compounds, (meth)acrylamide and its derivatives, vinyl esters, vinyl ethers, vinyl halides, basic monomers having an amino group, vinylpyridine, olefins, α,β-ethylenic unsaturated monomers, allyl compounds or reactive emulsifiers.

The polyfunctional vinyl compound which can be used, if necessary, in the present invention refers to a monomer having two or more vinyl bonds in a single molecule (provided that conjugated diene monomers are excluded) and includes, for example, an aromatic polyfunctional vinyl compound or a polyfunctional alkyl (meth)acrylate.

The aromatic polyfunctional vinyl compounds, include, for example, divinylbenzene or trivinylbenzene. The polyvinyl (meth)acrylic acid esters include, for example, ethylene glycol di(meth)acrylate, ethylene glycol di(meth)acrylate, 1,3-butylene glycol di(meth)acrylate, 1,4-butylene glycol di(meth)acrylate, propylene glycol di(meth)acrylate, 1,5-pentanediol di(meth)acrylate, neopentyl glycol di(meth)acrylate, 1,6-hexanediol di(meth)acrylate, diethylene glycol di(meth)acrylate, triethylene glycol di(meth)acrylate, tetraethylene glycol di(meth)acrylate, polyethylene glycol di(meth)acrylate, polypropylene glycol di(meth)acrylate, pentaerythritol tri(meth)acrylate, trimethylolpropane tri(meth)acrylate, tetramethylolmethane tetra(meth)acrylate, allyl (meth)acrylate, bis(4-acryloxypolyethoxyphenyl)propane, methoxypolyethylene glycol (meth)acrylate, β-(meth)acryloyloxyethyl hydrogen phthalate, β-(meth)acryloyloxyethyl hydrogen succinate, 3-chloro-2-hydroxypropyl (meth)acrylate, stearyl (meth)acrylate, phenoxyethyl (meth)acrylate, phenoxypolyethylene glycol (meth)acrylate, 2-hydroxy-1,3-di(meth)acryloxypropane, 2,2-bis[4-((meth)acryloxyethoxy)phenyl]propane, 2,2-bis[4-((meth)acryloxy.diethoxy)phenyl]propane or 2,2-bis[4-((meth)acryloxy.polyethoxy)phenyl]propane. Further, polyfunctional vinyl compounds having a hydrophilic group are also included therein.

These compounds can be used either singly or in the combination of two or more.

From the viewpoint of print wear characteristics and plate wiping-off resistance, it is preferred that the amount of polyfunctional vinyl compound is small. The amount thereof is preferably 0.5 part by mass or less per 100 parts by mass of the monomers for use in the hydrophilic copolymer (A).

The ethylenic monocarboxylic acid alkyl ester monomers having a hydrolyl group include, for example, 2-hydroxyethyl acrylate, 2-hydroxyethyl methacrylate, 2-hydroxypropyl acrylate, 2-hydroxypropyl methacrylate, 1-hydroxypropyl acrylate, 1-hydroxypropyl methacrylate and hydroxycyclohexyl (meth)acrylate.

The unsaturated dibasic acid alkyl esters include, for example, an alkyl crotonate, an alkyl itaconate, an alkyl fumarate or an alkyl maleate.

The vinyl cyanide compounds include, for example, acrylonitrile and methacrylonitrile.

The (meth)acrylamide or derivatives thereof include, for example, (meth)acrylamide, N-methylol(meth)acrylamide and an N-alkoxy(meth)acrylamide.

The vinyl esters include, for example, vinyl acetate, vinyl butylate, vinyl stearate, vinyl laurate, vinyl myristate, vinyl propionate and vinyl versatate.

The vinyl ethers include, for example, methyl vinyl ether, ethyl vinyl ether, propyl vinyl ether, butyl vinyl ether, amyl vinyl ether and hexyl vinyl ether.

The vinyl halides include, for example, vinyl chloride, vinyl bromide, vinyl fluoride, vinylidene chloride and vinylidene fluoride.

The basic monomers having an amino group, include, for example, aminoethyl (meth)acrylate, dimethylaminoethyl (meth)acrylate or diethylaminoethyl (meth)acrylate.

The olefins include, for example, ethylene.

The α,β-ethylenic unsaturated monomers containing silicon, include, for example, vinyltrichlorosilane and vinyltriethoxysilane.

These monomers can be used either singly or in mixtures of two or more.

Although the method of polymerizing the hydrophilic copolymer (A) for use in the present invention is not particularly limited, emulsion polymerization is preferably employed. The process of emulsion polymerization, for example, comprises introducing beforehand given amounts of water, an emulsifier and other additives into a reaction system whose temperature has been adjusted to a temperature suitable for polymerization and thereafter adding a polymerization initiator, monomers, an emulsifier, a regulator, etc. to the reaction system in a batch-wise manner or a continuous manner so as to effect polymerization. It is also a commonly used method to, introduce given amounts of a seed latex, an initiator, monomers and other regulators into a reaction system in advance, if necessary. It is also feasible to alter the layer structure of polymerized hydrophilic copolymer particles in stages by employing a method wherein unsaturated monomers, an emulsifier, other additives and a regulator are added at later stages to the reaction system. As properties representing the structure of each layer, for example, hydrophilicity, glass transition temperature, molecular weight and crosslinking density. With respect to the layer structure, the number of stages therein is not particularly limited.

An emulsifier (surfactant) for use in the emulsion polymerization is preferably, a reactive emulsifier from the viewpoint of water resistance and print wear characteristics.

The reactive emulsifier which can be employed in the present invention refers to an emulsifier (surfactant) that simultaneously has a radically polymerizable double bond, a hydrophilic functional group and a hydrophobic group in its molecular structure as well as the emulsification, dispersion and wetting functions like common emulsifiers, and that can synthesize a polymer having a particle diameter of 5 to 500 nm, when it is used in an amount of 0.1 part by mass or more per 100 parts by mass of unsaturated monomers other than the reactive emulsifier upon polymerizing the hydrophilic copolymer. Examples of the structure of radically polymerizable double bonds contained in the molecular structure include a vinyl group, an acryloyl group and a methacryloyl group. Examples of the hydrophilic functional groups contained in the molecular structure include anionic groups such as a sulfate group, a nitrate group, a phosphate group, a borate group and a carboxyl group; cationic groups such as an amino group; polyoxyalkylene chain structures such as polyoxyethylene, polyoxymethylene and polyoxypropylene; and a hydroxyl group. Examples of the hydrophobic groups contained in the molecular structure include an alkyl group and a phenyl group. These reactive emulsifiers include anionic emulsifiers, nonionic emulsifiers, cationic emulsifiers, amphoteric emulsifiers, etc., depending on the type of structure of hydrophilic functional group contained in the molecular structure. Moreover, the radically polymerizable double bond, hydrophilic functional group and hydrophobic group contained in the molecular structure thereof can have a plurality of structure types and functional groups.

Specific examples of these reactive emulsifiers (reactive surfactants) will be shown in (i) to (viii) below.

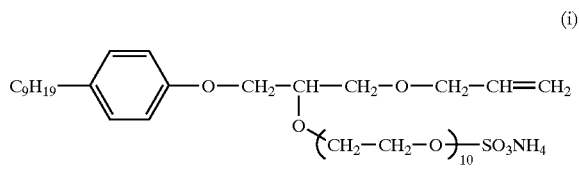

(i)

Trade name: Adeka Rea Soap SE1025 (Asahi Denka Kogyo K.K.)

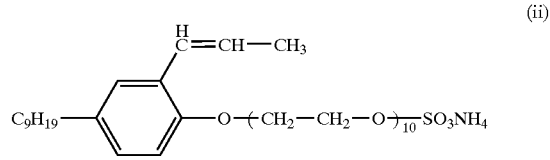

(ii)

Trade name: Aqualon HS1025 (Dai-ichi Kogyo Seiyaku Co., Ltd.)

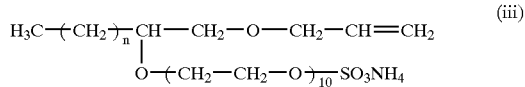

(iii)

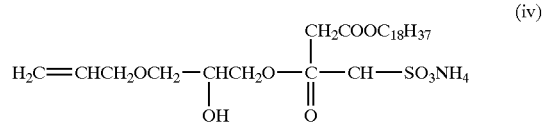

(iv)

Trade name: Latemul S-180A (Kao Corp.)

(v)

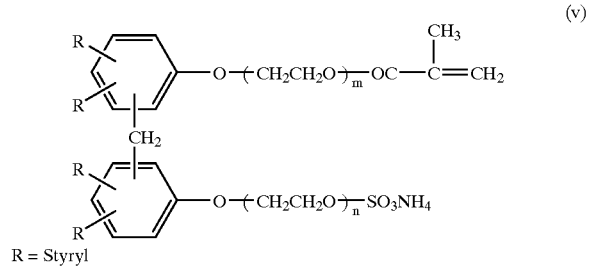

R = Styryl

Trade name: Antox MS-60 (Nippon Nyukazai Co., Ltd.)

(vi)

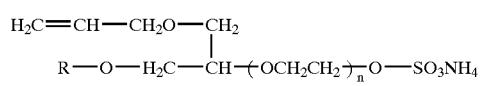

Trade name: SDX-1050 (Asahi Denka Kogyo K.K.)

(vii)

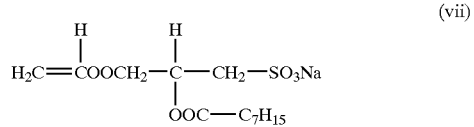

See JP-A-54(1979)-144317

(viii)

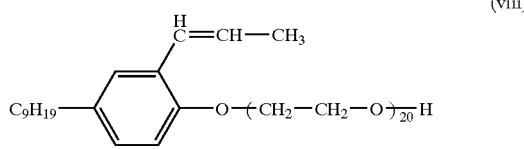

Trade name: Aqualon RN20 (Dai-ichi Kogyo Seiyaku Co., Ltd.).

Among those which can be used as a reactive emulsifier in the present invention, generally commercially available items include, but are not limited to the following examples: as an anionic surfactant, for example, Adeka Rea Soap SE (Asahi Denka Kogyo K.K., trade name), Aqualon HS, or BC, or KH (Dai-ichi Kogyo Seiyaku Co., Ltd., trade name), Latemul S (Kao Corp., trade name), Antox MS (Nippon Nyukazai Co., Ltd., trade name), Adeka Rea Soap SDX, or PP (Asahi Denka Kogyo K.K., trade name), Hitenol A (Dai-ichi Kogyo Seiyaku Co., Ltd., trade name), Eleminol RS (Sanyo Chemical Industries Ltd., trade name) or Spinomar (Tosoh Corporation, trade name); as a nonionic surfactant, for example, Aqualon RN or Noigen N (Dai-ichi Kogyo Seiyaku Co., Ltd., trade name) or Adeka Rea Soap NE (Asahi Denka Kogyo K.K., trade name). These emulsifiers may be used singly or in combination of two or more.

It is preferred that the amount of reactive emulsifier used in the emulsion polymerization is 1 part by mass or more from the viewpoint of excellent image reproducibility, but 20 parts by mass or less from the viewpoint of water resistance and print wear characteristics, per 100 parts by mass of the unsaturated monomers for use in the polymerization of hydrophilic copolymer (A).

In the present invention, a nonreactive emulsifier can be used.

The nonreactive emulsifiers, include, for example, an anionic surfactant such as a fatty acid soap, a rosin acid soap, a sulfonic acid salt, a sulfate, a phosphoric acid ester, a polyphosphoric acid ester or an acyl sarcosinate; or a cationic surfactant such as a fat and oil derivative converted to nitrile, a fat and oil derivative, a fatty acid derivative or an α-olefin derivative; or a nonionic surfactant such as an alcohol ethoxylate, an alkylphenol ethoxylate, a propoxylate, an aliphatic alkanolamide, an alkylpolyglycoside, a polyoxyethylene sorbitan fatty acid ester or an oxyethyleneoxypropylene block copolymer.

The sulfonic acid salts include, for example, an alkyl sulfonate, an alkyl sulfate, an alkyl sulfosuccinate, a polyoxyethylene alkyl sulfate, a sulfonated fat and oil, an alkyl diphenyl ether disulfonate, an α-olefin sulfonate, an alkyl glyceryl ether sulfonate or an N-acylmethyltaurate salt.

It is preferred that the amount of nonreactive emulsifier used in the emulsion polymerization is small from the viewpoint of water resistance and hygroscopicity, for example, 1 part by mass or less per 100 parts by mass of hydrophilic copolymer (A).

The reactive emulsifier and the nonreactive emulsifier can be used in combination.

A known chain transfer agent can be used in the polymerization of hydrophilic copolymer (A) for use in the present invention. For example, chain transfer agents containing a sulphur atom include alkanethiols, such as t-dodecylmercaptan and n-dodecylmercaptan; thioalkyl alcohols, such as mercaptoethanol and mercaptopropanol; thioalkylcarboxylic acids such as, thioglycolic acid and thiopropionic acid; thiocarboxylic acid alkyl esters, such as octyl thioglycolate and octyl thiopropionate; and sulfides such as dimethyl sulfide or diethyl sulfide. In addition, examples of the chain transfer agent, for example, halogenated hydrocarbons such as terpinolene, dipentene, t-terpinene or carbon tetrachloride. Among these chain transfer agents, an alkanethiol is preferred from the viewpoint of high rate of chain transfer and from the viewpoint that the balance among the properties of a resulting polymer is desirable. These chain transfer agents can be used singly or in mixture of two or more. These chain transfer agents are either mixed with monomers before being fed into the reaction system, or added singly in a given amount at a given timing.

The amount of the chain transfer agent used is preferably 0.1 part by mass or more from the viewpoint of processability, but 10 parts by mass or less from the viewpoint of inhibiting a sharp drop of molecular weight, per 100 parts by mass of the unsaturated monomers for use in the polymerization of hydrophilic copolymer (A).

In the polymerization of the hydrophilic copolymer (A) for use in the present invention, a polymerization reaction retarder can be used, if necessary. The polymerization reaction retarder refers to a compound which lowers the rate of radical polymerization when added to an emulsion polymerization system. More specifically, it refers to a polymerization rate retarder, a polymerization inhibitor, a chain transfer agent with low radical re-initiation reactivity or a monomer with low radical re-initiation reactivity. The polymerization reaction retarder is used for adjusting polymerization reaction rate and for adjusting latex properties. This polymerization reaction retarder is added to the reaction system in a batchwise or continuous manner. When the polymerization reaction retarder is used, the strength of latex film tends to increase. Although the details of reaction mechanism has not yet been elucidated, it is believed that the polymerization reaction retarder is closely associated with the steric configuration of polymer, and hence it is presumed that the polymerization reaction retarder is effective in adjusting latex film properties. Examples of the polymerization reaction retarder include quinones, such as o-, m- and p-benzoquinones; nitro compounds, such as nitrobenzene or o-, m- or p-dinitrobenzene; amines, such as diphenylamine; catechol derivatives, such as t-butylcatechol; 1,1-disubstituted vinyl compounds such as 1,1-diphenylethylene, α-methylstyrene or 2,4-diphenyl-4-methyl-1-pentene; or 1,2-disubstituted vinyl compounds such as 2,4-diphenyl-4-methyl-2-pentene or cyclohexene. In addition, the polymerization reaction retarders include the compounds described as a polymerization inhibitor or polymerization retarder in "POLYMER HANDBOOK 3rd Ed. (J. Brandup, E. H. Immergut: John Wiley & Sons, 1989)" and "*Kaitei Kobunshi Gosei No Kagaku* (Revised: Chemistry of Polymer Synthesis) (Otsu, Kagaku Dojin, 1979)". Among these polymerization reaction retarders, 2,4-diphenyl-4-methyl-1-pentene (α-methylstyrene dimer) is especially preferred from the viewpoint of reactivity. These polymerization reaction retarders can be used either singly or in mixture of two or more.

The amount of polymerization reaction retarder used is preferably 10 parts by mass or less per 100 parts by mass of the unsaturated monomers for use in the polymerization of hydrophilic copolymer (A) from the viewpoint of suppressing the sharp drop of polymerization rate.

The radical polymerization initiator for use in the emulsion polymerization refers to a compound which undergoes a radical decomposition under heating or in the presence of a reducing substance to initiate the addition polymerization of monomers. Both an inorganic initiator and an organic initiator can be used. Examples of the radical polymerization initiator include, water-soluble or oil-soluble peroxodisulfuric acid salts, peroxides, azobis compounds and the like. More specifically, for example, potassium peroxodisulfate, sodium peroxodisulfate, ammonium peroxodisulfate, hydrogen peroxide, t-butyl hydroperoxide, benzoyl peroxide, 2,2-azobisbutyronitrile, cumene hydroperoxide and the like are included. In addition, further examples of the radical polymerization initiators include the compounds described in "POLYMER HANDBOOK 3rd Ed. (J. Brandrup and E. H. Immergut, published by John Wiley & Sons (1989)". Also, the so-termed redox polymerization method wherein the polymerization initiator is used in combination with a reducing agent, such as acidic sodium sulfite, ascorbic acid or its salt, erythorbic acid or a salt thereof, or rongalite, can be employed. Among the above polymerization initiators, peroxodisulfuric acid salts are especially preferred.

The amount of polymerization initiator used is preferably 0.2 part by mass or more from the viewpoint of stability during polymerization, but 3 parts by mass or less from the viewpoint of antihygroscopicity of resin composition, per 100 parts by mass of unsaturated monomers for use in the polymerization of hydrophilic copolymer (A).

In the present invention, various polymerization regulators can be added, if necessary. For example, sodium hydroxide, potassium hydroxide, ammonium hydroxide, sodium hydrogen carbonate, sodium carbonate or disodium hydrogen phosphate can be added as a pH regulator. Further, various chelating agents such as sodium ethylenediaminetetraacetate can be added as a polymerization regulator. Still further, various additives, for example, a viscosity lowering agent such as an alkali-functioned latex or hexametaphosphoric acid, a water-soluble polymer such as polyvinyl alcohol or carboxymethylcellulose, a thickener, various age resisters, an ultraviolet absorber, an antiseptic, a germicide, a defoamer, a dispersant such as sodium polyacrylate, a waterproofing agent, a metal oxide such as zinc oxide, a crosslinking agent such as an isocyanate compound or an epoxy compound, a lubricant and a water retainer may be added as other additives. The method of adding these additives is not particularly limited, and the addition can be effected irrespective of being during the polymerization or after the polymerization of hydrophilic copolymer.

The polymerization temperature at which the emulsion polymerization is performed is preferably 60° C. or higher from the viewpoint of developability with aqueous developer solution, print wear characteristics and plate wiping-off resistance, but 120° C. or below from the viewpoint of avoiding the difficulty in production due to a pressure increase during the polymerization. More preferably, the temperature is in the range of 70 to 120° C.

The number average particle diameter of obtained hydrophilic copolymer (A) is preferably in the range of 5 to 500 nm. The number average particle diameter is preferably 500 nm or less from the viewpoint of developability with aqueous developer solution and image reproducibility, but 5 nm or more from the viewpoint of print wear characteristics. More preferably, the number average particle diameter is in the range of 5 to 100 nm.

The toluene gel ratio of obtained hydrophilic copolymer (A) is preferably in the range of 60 to 99%. The toluene gel ratio is preferably 80% or higher from the viewpoint of printing plate strength and print wear characteristics, but 95% or below from the viewpoint of compatibility (miscibility), processability and developability with aqueous developer solution of photosensitive resin.

The toluene gel ratio is determined in the following manner. An appropriate amount of a dispersion of about 30 wt % concentration obtained by an emulsion polymerization of hydrophilic copolymer (A) is dropped on a polytetrafluoroethylene sheet and dried at 130° C. for 30 min. 0.5 g of dried hydrophilic copolymer (A) is collected, immersed in 30 ml of 25° C. toluene, shaken with the use of a shaker for 3 hr and filtered through a 320 SUS mesh. Matter not having passed through the mesh is dried at 130° C. for 1 hr and weighed. The toluene gel ratio is defined as a weight fraction (%) obtained by dividing the above weight by 0.5 (g).

The ratio of the amount of hydrophilic copolymer (A) to the total amount of photosensitive resin composition for flexographic printing is preferably 20 wt % or larger from the viewpoint of developability with aqueous developer solution, but 60 wt % or smaller from the viewpoint of suppression of hygroscopicity and water resistance and ink swelling resistance.

The thermoplastic elastomer (B) for use in the present invention refers to an elastomer which exhibits rubber elasticity at about room temperature and is resistant to plastic deformation and which is plasticized by heat upon mixing the composition by means of, for example, an extruder. The thermoplastic elastomers include, for example, a thermoplastic block copolymer, 1,2-polybutadiene and a polyurethane-type elastomer.

Among these thermoplastic elastomers, the thermoplastic block copolymer is preferred. In particular, a thermoplastic block copolymer obtained by polymerizing a monovinyl substituted aromatic hydrocarbon monomer and a conjugated diene monomer is more preferred. For example, styrene, α-methylstyrene, p-methylstyrene or p-methoxystyrene can be used as the monovinyl substituted aromatic hydrocarbon monomer. For example, butadiene or isoprene can be used as the conjugated diene monomer. Representative examples of thermoplastic block copolymers include a styrene-butadiene-styrene block copolymer and a styrene-isoprene-styrene block copolymer. The content of monovinyl substituted aromatic hydrocarbon in the thermoplastic elastomer is preferably 8 wt % or more from the viewpoint of suppression of the cold flow resistance exhibited in laminating of photosensitive resin plates before exposure, but 50 wt % or less from the viewpoint of suppression of the deterioration of printing quality attributed to an excessive increase of printing plate hardness.

The average proportion of vinyl bonds in the conjugated diene segment of the thermoplastic elastomer is preferably 5% or higher from the viewpoint of image reproducibility of printing plate, but 40% or lower from the viewpoint of suppression of printing plate surface stickiness. The average proportion is more preferably in the range of 10 to 35%.

The average contents of monovinyl substituted aromatic hydrocarbon and conjugated diene and the average proportion of vinyl bond units in the thermoplastic elastomer can be determined by IR spectroscopy or NMR.

The amount of thermoplastic elastomer (B) used, based on the total amount of photosensitive resin composition for flexographic printing, is preferably 10 wt % or more from the viewpoint of excellent physical properties (elongation (extension)) of printing plates and also water resistance and ink swelling resistance thereof, but 40 wt % or less from the viewpoint of developability with aqueous developer solutions.

The photopolymerizable unsaturated monomer (C) for use in the present invention may be, for example, any of esters of acrylic acid, methacrylic acid, fumaric acid and maleic acid; derivatives of acrylamide and methacrylamide; allyl esters, styrene and derivatives thereof; and N-substituted maleimide compounds.

Specific examples thereof include diacrylates and dimethacrylates of alkanediols such as hexanediol and nonanediol; diacrylates and dimethacrylates of ethylene glycol, diethylene glycol, propylene glycol, dipropylene glycol, polyethylene glycol and butylene glycol; trimethylolpropane triacrylate or trimethacrylate and pentaerythritol tetraacrylate or tetramethacrylate; N,N'-hexamethylenebisacrylamide or -methacrylamide; and styrene, vinyltoluene, divinylbenzene, diacrylphthalate, triallyl cyanurate, diethyl fumarate, dibutyl fumarate, dioctyl fumarate, distearyl fumarate, butyl octyl fumarate, diphenyl fumarate, dibenzyl fumarate, dibutyl maleate, dioctyl maleate, bis(3-phenylpropyl) fumarate, dilauryl fumarate, dibehenyl fumarate and N-laurylmaleimide. These may be used singly or in combination of two or more.

The amount of photopolymerizable unsaturated monomer (C) used, based on the total amount of photosensitive resin composition for flexographic printing, is preferably 1 wt % or more from the viewpoint of capability of forming fine dots or characters, but 30 wt % or less from the viewpoint of resistance to cold flow exhibited upon laminating photosensitive resin plates before exposure and from the viewpoint of suppression of the deterioration of printing quality attributed to an excessive increase of printing plate hardness.

Examples of the photopolymerization initiator (D) for use in the present invention include, for example, benzophenone, 4,4-bis(diethylamono)-benzophenone, t-butylanthraquinone and 2-ethylanthraquinone; thioxanthones such as 2,4-diethylthioxanthone, isopropylthioxanthone and 2,4-dichlorothioxanthone; acetophenones such as diethoxyacetophenone, 2-hydroxy-2-methyl-1-phenylpropan-1-one, benzyldimethylketal, 1-hydroxycyclohexyl-phenylketone, 2-methyl-2-morpholino(4-thiomethylphenyl)propan-1-one and 2-benzyl-2-dimethylamino-1-(4-morpholinophenyl)-butanone; benzoin ethers such as benzoin methyl ether, benzoin ethyl ether, benzoin isopropyl ether and benzoin isobutyl ether; acylphosphine oxides such as 2,4,6-trimethylbenzoyldiphenylphosphine oxide, bis(2,6-dimethoxybenzoyl)-2,4,4-trimethylpentylphosphine oxide and bis(2,4,6-trimethylbenzoyl)-phenylphosphine oxide; methylbenzoyl formate; 1,7-bisacridinylheptane; and 9-phenylacridine. These can be used singly or in combination.

The amount of photopolymerization initiator (D) used, based on the total amount of photosensitive resin composition, is preferably in the range of 0.1 to 10 wt %. The amount is preferably 0.1 wt % or more from the viewpoint of capability of forming fine dots or characters, but 10 wt % or less from the viewpoint of exposure sensitivity lowering attributed to a drop of transmittance of actinic rays such as ultraviolet radiation.

To the photosensitive resin composition of the present invention, if necessary, various supplementary additives, such as plasticizers, thermal polymerization inhibitors, ultraviolet absorbers, antihalation agents and photostabilizers, can be added in addition to the above essential components.

The plasticizer is a liquid having fluidity at room temperature, and can be, for example, hydrocarbon oils such as naphthenic oil and paraffinic oil, liquid polybutadiene, liquid polyisoprene, liquid polybutadiene modification products, liquid acrylonitrile-butadiene copolymer, liquid styrene-butadiene copolymer, polystyrene of 2,000 or less number average molecular weight, sebacic acid esters and phthalic acid esters. These components may have photopolymerizable reactive groups.

For maintaining the precision of printing plate, the photosensitive resin composition of the present invention may be provided with a support of, for example, polyester on the side opposite to relief. Because the photosensitive resin composition of the present invention may be sticky depending on the composition thereof, a flexible film layer which can be developed with an aqueous developer solution may be provided on a surface of the photosensitive resin composition so as to improve the contact with a negative film superimposed thereon and so as to make reutilization of the negative film possible.

The photosensitive resin composition of the present invention can be produced by blending the above components (A) to (D) by means of, for example, an extruder or a kneader. The photosensitive resin composition after blending can be formed into a layer with a desired thickness by hot press molding, or calendering, or extrusion.

A support or flexible film layer can be closely contacted to the photosensitive layer by roll laminating after sheeting. After the laminating, hot pressing may be performed so as to obtain the photosensitive layer with higher precision.

An actinic ray source for use in photohardening of the photosensitive resin composition of the present invention may be, for example, a low pressure mercury lamp, a high pressure mercury lamp, an ultraviolet fluorescent lamp, a carbon arc lamp, a xenon lamp, a zirconium lamp or sunlight.

The photosensitive resin composition of the present invention is exposed to light through a negative film so as to form an image. Thereafter, unexposed portion is removed (developed) with the use of an aqueous developer solution, so that a relief can be obtained.

The aqueous developer solution for use in the present invention is obtained by adding to water a surfactant such as a nonionic or an anionic surfactant and, if necessary, a pH regulator, a washing accelerator, etc. Specific examples of the nonionic surfactant include, for example, a polyoxyalkylene alkyl or alkenyl ether, a polyoxyalkylene alkyl or alkenyl phenyl ether, a polyoxyalkylenealkyl (or alkenyl) amine, a polyoxyalkylenealkyl (or alkenyl)amide and an ethylene oxide/propylene oxide block adduct. Specific examples of the anionic surfactant include, for example, a linear alkylbenzene sulfonate having an alkyl having 8 to 16 carbon atoms on the average, an α-olefin sulfonate having 10 to 20 carbon atoms on the average, a dialkyl sulfosuccinate having an alkyl or alkenyl having 4 to 10 carbon atoms, a sulfonate of fatty acid lower alkyl ester, an alkyl sulfate having 10 to 20 carbon atoms on the average, an alkyl ether sulfate having a linear or branched chain alkyl or alkenyl having 10 to 20 carbon atoms on the average and having an average 0.5 to 8 mol of ethylene oxide added, and a saturated or unsaturated fatty acid salt having 10 to 22 carbon atoms on the average.

The pH regulator is preferably, for example, a borate, a carbonate, a silicate, a metasilicate, a succinate or an acetate. In particular, sodium silicate is preferred from the viewpoint of high solubility in water.

Furthermore, a washing auxiliary can be used. The use thereof in combination with the above surfactants and pH regulators enhances washing capacity. Specific examples of the washing auxiliary include amines such as monoethanolamine, diethanolamine and triethanolamine; ammonium salts such as tetramethylammonium hydroxide; glycol ethers; and paraffinic hydrocarbons.

These washing auxiliaries are added to water in an appropriate mixing ratio ranging from 0.1 to 50 wt %, preferably from 0.2 to 10 wt % and mixed before use.

Still further, if necessary, these washing auxiliaries may be used in combination with a defoamer, a dispersant, a corrosion inhibitor and an antiseptic agent.

After the development, the obtained plate is generally dried in an oven at about 60° C. for 15 to 120 min.

The photosensitive resin composition of the present invention, depending on the composition thereof, may have stickiness on the plate surface even after the drying. Such stickiness can be eliminated by a known surface treatment. As a preferred surface treatment, there can be mentioned an exposure to actinic rays of 300 nm or less wavelength.

The present invention will be described in details below with reference to the following Production Examples, Working Examples and Comparative Examples.

PRODUCTION EXAMPLES

Polymerization of Hydrophilic Copolymer (A)

Production Example 1

Polymerization of Hydrophilic Copolymers (A) as in Examples 1 to 18 and Comparative Examples 1 to 7 in Tables 1 to 4 and in Examples 20 to 22 in Table 5

125 parts by mass of water and 3 parts by mass, out of the total amount indicated in the Tables, of emulsifier were initially introduced into a pressure reaction vessel equipped with an agitator and a jacket for temperature control. The internal temperature of the pressure reaction vessel was raised to 80° C., and an oily mixed liquid consisting of a mixture of monomers in proportions listed in Tables 1 to 5 and t-dodecylmercaptan and an aqueous solution consisting of 28 parts by mass of water, 1.2 parts by mass of sodium peroxodisulfate, 0.2 part by mass of sodium hydroxide and the rest of emulsifier indicated in the Tables, i.e. 1 part by mass, were added at constant flow rate over periods of 5 hr and 6 hr, respectively. The temperature of 80° C. was maintained for 1 hr so as to complete the polymerization reaction, and the reaction mixture was cooled. The pH value of the thus formed copolymer latex was adjusted to 7 with sodium hydroxide, and unreacted monomers were removed by steam stripping. The copolymer latex was filtered through a 200-mesh metal net. In this manner, the copolymer was adjusted to have the final solids content of 40 wt % in order to obtain the hydrophilic copolymer (A) solution.

The solutions after emulsion polymerization were dried at 60° C., thereby obtaining the intended hydrophilic copolymers.

Production Example 2

Polymerization of Hydrophilic Copolymer (A) of Example 19 in Table 5

The hydrophilic copolymer (A) was obtained in the same manner as in Production Example 1, except that 1 part by mass, out of the total amount shown in the Table, of the reactive emulsifier was initially introduced into the pressure reaction vessel while the rest of the reactive emulsifier, i.e. 1 part by mass, was added in the form of an aqueous solution.

Production Example 3

Polymerization of Hydrophilic Copolymer (A) of Example 23 in Table 5

The hydrophilic copolymer (A) was obtained in the same manner as in Production Example 1, except that 13.5 parts by mass, out of the total amount shown in the Table, of the reactive emulsifier was initially introduced into the pressure reaction vessel while the rest of the reactive emulsifier, i.e. 1.5 parts by mass, was added in the form of an aqueous solution.

Production Example 4

Polymerization of Hydrophilic Copolymer (A) of Example 24 in Table 5

The hydrophilic copolymer (A) was obtained in the same manner as in Production Example 1, except that 3 parts by mass, out of the total amount shown in the Table, of the reactive emulsifier, and 0.5 part by mass of the nonreactive emulsifier were initially introduced into the pressure reaction vessel while the rest of the reactive emulsifier, i.e. 1 part by mass, was added in the form of an aqueous solution.

Examples 1 to 24 and Comparative Examples 1 to 7

(1) Preparation of Photosensitive Resin Composition and Photosensitive Resin Plate 35 parts by mass of each of the hydrophilic copolymers (A) obtained in the Production Examples 1 to 4 and 25 parts by mass of styrene butadiene block copolymer (Crayton D-KX405 produced by Shell Chemicals) were blended together by means of a pressure kneader at 140° C. for 10 min. Thereafter, 30 parts by mass of liquid polybutadiene (B-2000 produced by Nippon Petrochemicals Co., Ltd.), 5 parts by mass of 1,6-hexanediol diacrylate, 5 parts by mass of 1,6-hexanediol dimethacrylate, 2 parts by mass of 2,2-dimethoxyphenylacetophenone and 1 part by mass of 2,6-di-t-butyl-p-cresol were added little by little over a period of 15 min. After the completion of addition, the mixture was further kneaded for 10 min to obtain photosensitive resin compositions.

Each of the photosensitive resin compositions was taken out, sandwiched between a 100 µm thick polyester film (hereinafter simply referred to as "PET") coated with a thermoplastic elastomer based adhesive on one side and a 100 µm thick PET coated with a 5 µm thick polyvinyl alcohol (PVA) on the other side, and formed into a 3 mm thick sheet by means of a press at 130° C.

(2) Preparation of Printing Plate

Each of the sheets obtained in item (1) above, was exposed to ultraviolet light from the side of the adhesive-coated PET, by means of ultraviolet exposer (JE-A2-SS manufactured by Nippon Denshi Seiki) so that the thickness of cured layer was about 1.8 mm. Subsequently, the PVA-coated PET was peeled in such a manner that PVA remained on the resin surface, and a negative film bearing an image to be printed was closely contacted thereto and exposed by means of the above exposer for 10 min. After the exposure, the negative film was detached, and the cured layer was washed with a separately prepared aqueous solution containing 5 wt % of polyoxyalkylene alkyl ether, 2 wt % of sodium borate and 0.7 wt % of paraffin having 10 carbon atoms (aqueous developer solution) at 40° C. by means of washer (JOW-A3-P) manufactured by Nippon Denshi Seiki so as to remove unexposed portions. Drying and thereafter post-exposure by means of an ultraviolet germicidal radiation lamp and an ultraviolet chemical lamp were performed. Thus, printing plates were obtained.

(3) Method of Evaluation (a) Compatibility (Dispersibility)

Each mixture of photosensitive resin composition was visually inspected for any remaining particles. When any particles were observed, the compatibility was judged as x. When no particles were observed, the compatibility was judged as ○. With respect to the mixtures having been judged as x, the following evaluations were not carried out.

(b) Developability by Aqueous Developer Solution

An unexposed resin plate was washed with the above aqueous developer solution in the above washer for 15 min. The resin plate thickness (t) reduced by the washing was measured, and 15 min/t (mm) was calculated, thereby determining the time (min) required for development of 1 mm. The shorter the developing time, the greater the advantage. The developing time was judged as ⊚ when 17 min/mm or less; judged as ○ when less than 20 min/mm; and judged as x when 20 min/mm or more.

(c) Image Reproducibility

The image reproducibility of each printing plate was evaluated by assessing through a microscope the configuration of 500 µm depressed fine lines and protrudent fine lines with respect to each relief image. The image reproducibility was judged as ○ when the groove of depressed fine lines was deep and further the protrudent fine lines were sharp and free from thickening; and judged as x when the groove of depressed fine lines was shallow and/or the protrudent fine lines were not sharp and thickened.

(d) Water Resistance (Water Swelling Ratio)

Each printing plate was immersed in water for 24 hr, and the increment (%) from the weight before the immersion was calculated. The smaller the increment, the greater the advantage. The swelling ratio was judged as being acceptable when 1.3% or less.

(e) Print Wear Characteristics after Attachment of and Swelling with Aqueous Base Ink The surface strength of printing plate (print wear characteristics) was evaluated by simultatively applying an abrasion wheel (hard abrasion wheel, Taber abrader manufactured by Tester Sangyo Co., Ltd.). A printing plate with overall solid surface was prepared and immersed in a 10% aqueous isopropyl alcohol solution as a substitute for water base ink for 16 hr. The abrasion wheel was applied to the printing plate after immersion, and rotated 1000 times. The abrasion loss of the printing plate was measured. The abrasion loss was calculated by dividing the loss in weight by the area of the abrasion wheel that was in contact with the solid surface. The abrasion loss was judged as ⊚ when 7 mg/cm$^2$ or less; judged as ○ when less than 10 mg/cm$^2$; and judged as x when 10 mg/cm$^2$ or more.

(f) Plate Wiping-off Resistance

Herein, the terminology "plate wiping-off resistance" refers to the degree of resistance of printing plate to damaging of image portions in a printing plate, in the operation for wiping off the water base ink from the printing plate.

The degree of plate wiping-off resistance was measured simulatively, as shown in FIG. 1. Printing plate 1 (top view) having 8 to 12 point-large characters was prepared by using negative film 2. The printing plate 1 was immersed in a 10% aqueous isopropyl alcohol solution as a substitute for water base ink for 16 hr, and thereafter rubbed from side to side 300 times by means of NP print wear characteristics tester (manufactured by Niimura Printing Co., Ltd., item brought into contact 3: 8 cm×6 cm cloth, load: 1 kg). The degree of damage to the characters after the rubbing was observed through a microscope. In the evaluation of the plate wiping-off resistance of printing plate, the plate wiping-off resistance was judged as ○ when the characters were not damaged, and judged as x when the characters were damaged. However, with respect to the printing plates having been judged as x in image reproducibility, the evaluation was omitted.

The evaluation test results of the physical properties obtained in the above methods are shown in Tables 1 and 2. In overall evaluation, ○ means being acceptable with respect to all the evaluation items (a) to (f). The obtained results will be described below with respect to the Examples and Comparative Examples.

A summary of the evaluation test results of resin compositions and printing plates obtained in Examples 1 to 5 and Comparative Examples 1 and 2 are listed in Table 1.

It is apparent from Table 1 that when the proportion of unsaturated monomer having a carboxyl group (1) is too low, the developing time would be prolonged, and that when the proportion of unsaturated monomer having a carboxyl group (1) is too high, not only the water resistance but also, due to an increase of the abrasion loss at ink attachment, the print wear characteristics would be deteriorated.

TABLE 1

|  | Example 1 | Example 2 | Example 3 | Example 4 | Example 5 | Comp. Ex. 1 | Comp. Ex. 2 |
|---|---|---|---|---|---|---|---|
| (A) Composition of hydrophilic copolymer (pts. wt.) | | | | | | | |
| (1) acrylic acid | 2 | 2 | 5 | 2 | 2 | 1 | 2 |
| (1) methacrylic acid | 5 | 5 | 0 | 10 | 5 | 0 | 15 |
| (1) itaconic acid | | | 1 | | | | |
| Sodium methacrylsulfonate *1 | | | | | 2 | | |
| (2) butadiene | 60 | 60 | 60 | 60 | 60 | 60 | 60 |
| (3) styrene | 15 | 15 | 15 | 12 | 15 | 15 | 15 |
| (4) butyl acrylate | 18 | 17 | 20 | 16 | 16 | 24 | 8 |
| Total amt. of emulsifier (emulsifier: (i) *2) | 4 | 4 | 4 | 4 | 4 | 4 | 4 |
| t-Dodecylmercaptan | 2.0 | 2.0 | 2.0 | 2.0 | 2.0 | 2.0 | 2.0 |
| Emulsion polymn. temp. (° C.) | 80 | 80 | 80 | 80 | 80 | 80 | 80 |
| No. av. particle diam. of copolymer (A) (nm) | 57 | 48 | 55 | 48 | 45 | 58 | 47 |
| Toluene gel ratio (%) | 88 | 87 | 88 | 88 | 89 | 87 | 91 |
| Evaluation | | | | | | | |
| (a) compatibility (dispersibility) | ○ | ○ | ○ | ○ | ○ | ○ | ○ |
| (b) developability with aqueous developer solution *3 | ◎ | ◎ | ◎ | ◎ | ◎ | X | ◎ |
| (c) image reproducibility | ○ | ○ | ○ | ○ | ○ | X | X |
| (d) water swelling ratio (water resistance) (%) *4 | 1.0 | 1.0 | 1.3 | 1.2 | 1.2 | 1.0 | 1.5 |
| (e) print wear characteristics *5 | ◎ | ◎ | ◎ | ◎ | ◎ | ◎ | X |
| (f) plate wiping-off resistance | ○ | ○ | ○ | ○ | ○ | Evaluation omitted | Evaluation omitted |
| Overall evaluation *6 | ○ | ○ | ○ | ○ | ○ | X | X |

*1 Produced by Asahi Kasei Fine Chemical, trade name SMAS.
*2 Emulsifier: (i) means emulsifier (i) specified on page 20 of this specification.
*3 Developing time: 17 min/mm or less ◎, less than 20 min/mm ○, and 20 min/mm or more X.
*4 Water swelling ratio when 1.3% or less was regarded as being acceptable.
*5 Abrasion loss: 7 mg/cm² or less ◎, less than 10 mg/cm² ○, and 10 mg/cm² or more X.
*6 ○ means being acceptable with respect to all the evaluation items (a) to (f).

A summary of the evaluation test results of resin compositions and printing plates obtained in Examples 1, 6 and 7 and Comparative Examples 3 and 4 are listed in Table 2.

It is apparent from Table 2 that when the proportion of styrene is too low, the compatibility would be deteriorated, and that when the proportion of styrene is too high, the developing time would be prolonged and the image reproducibility would be deteriorated.

In Comparative Example 3, because the compatibility was low and a number of white particles were observed by visual inspection, other evaluations were omitted.

TABLE 2

|  | Example 1 | Example 6 | Example 7 | Comp. Ex. 3 | Comp. Ex. 4 |
|---|---|---|---|---|---|
| (A) Composition of hydrophilic copolymer (pts. wt.) | | | | | |
| (1) acrylic acid | 2 | 2 | 2 | 2 | 2 |
| (1) methacrylic acid | 5 | 5 | 5 | 5 | 5 |
| (2) butadiene | 60 | 60 | 65 | 60 | 60 |
| (3) styrene | 15 | 10 | 5 | 1 | 30 |
| (4) butyl acrylate | 18 | 23 | 23 | 32 | 3 |
| Total amt. of emulsifier (emulsifier: (i) *1) | 4 | 4 | 4 | 4 | 4 |
| t-Dodecylmercaptan | 2.0 | 2.0 | 2.0 | 2.0 | 2.0 |
| Emulsion polymn. temp. (° C.) | 80 | 80 | 80 | 80 | 80 |
| No. av. particle diam. of copolymer (A) (nm) | 57 | 59 | 62 | 63 | 45 |
| Toluene gel ratio (%) | 88 | 87 | 86 | 85 | 90 |
| Evaluation | | | | | |
| (a) compatibility (dispersibility) | ○ | ○ | ○ | X | ○ |
| (b) developability with aqueous developer solution *2 | ◎ | ◎ | ◎ | Evaluation omitted | X |
| (c) image reproducibility | ○ | ○ | ○ | Evaluation omitted | X |
| (d) water swelling ratio (water resistance) (%) *3 | 1.0 | 1.0 | 1.0 | Evaluation omitted | 1.0 |
| (e) print wear characteristics *4 | ◎ | ◎ | ◎ | Evaluation omitted | ◎ |
| (f) plate wiping-off resistance | ○ | ○ | ○ | Evaluation omitted | Evaluation omitted |
| Overall evaluation *5 | ○ | ○ | ○ | X | X |

*1 Emulsifier: (i) means emulsifier (i) specified on page 20 of this specification.
*2 Developing time: 17 min/mm or less ◎, less than 20 min/mm ○, and 20 min/mm or more X.
*3 Water swelling ratio when 1.3% or less was regarded as being acceptable.
*4 Abrasion loss: 7 mg/cm² or less ◎, less than 10 mg/cm² ○, and 10 mg/cm² or more X.
*5 ○ means being acceptable with respect to all the evaluation items (a) to (e).

A summary of the evaluation test results of resin compositions and printing plates obtained in Examples 1 and 8 to 11 and Comparative Examples 5 to 7 are listed in Table 3.

It is apparent from Table 3 that when the proportion of butadiene is too low, the water resistance and the print wear characteristics when ink is adhered would be deteriorated. It is also apparent that when the proportion of alkyl (meth)acrylate is too low, the developability with aqueous developer solution would be deteriorated, and that when the proportion of alkyl (meth)acrylate is too high, the water resistance and print wear characteristics would be deteriorated.

all the evaluation tests, irrespective of the employed acrylate being butyl acrylate, ethyl acrylate or 2-ethylhexyl acrylate.

A summary of the evaluation test results of resin compositions and printing plates obtained in Examples 12 to 18 are listed in Table 4.

Table 4 shows that satisfactory performance can be obtained at varied polymerization temperatures and gel ratios. However, specifically, it was found that when the polymerization temperature was lowered, the developability with aqueous developer solution tended to drop, and that when the gel ratio was low, not only the developability with

TABLE 3

|  |  | Example 1 | Example 8 | Example 9 | Example 10 | Example 11 | Comp. Ex. 5 | Comp. Ex. 6 | Comp. Ex. 7 |
|---|---|---|---|---|---|---|---|---|---|
| (A) | Composition of hydrophilic copolymer (pts. wt.) | | | | | | | | |
|  | (1) acrylic acid | 2 | 3 | 2 | 2 | 2 | 2 | 2 | 2 |
|  | (1) methacrylic acid | 5 | 4 | 5 | 5 | 5 | 5 | 5 | 1 |
|  | (2) butadiene | 60 | 70 | 55 | 60 | 60 | 30 | 75 | 55 |
|  | (3) styrene | 15 | 10 | 15 | 15 | 15 | 15 | 17 | 7 |
|  | (4) butyl acrylate | 18 | 13 | 23 | | | 48 | 1 | 35 |
|  | (4) ethyl acrylate | | | | 18 | | | | |
|  | (4) 2-ethylhexyl acrylate | 18 | | | | | | | |
|  | Total amt. of emulsifier (emulsifier: (i) *1) | 4 | 4 | 4 | 4 | 4 | 4 | 4 | 4 |
|  | t-Dodecylmercaptan | 2.0 | 2.0 | 2.0 | 2.0 | 2.0 | 2.0 | 2.0 | 2.0 |
| Emulsion polymn. temp. (° C.) | | 80 | 80 | 80 | 80 | 80 | 80 | 80 | 80 |
| No. av. particle diam. of copolymer (A) (nm) | | 57 | 51 | 60 | 55 | 50 | 61 | 58 | 52 |
| Toluene gel ratio (%) | | 88 | 90 | 87 | 88 | 88 | 86 | 89 | 89 |
| Evaluation | | | | | | | | | |
| (a) | compatibility (dispersibility) | ○ | ○ | ○ | ○ | ○ | ○ | ○ | ○ |
| (b) | developability with aqueous developer solution *2 | ⊚ | ⊚ | ⊚ | ⊚ | ⊚ | X | X | ⊚ |
| (c) | image reproducibility | ○ | ○ | ○ | ○ | ○ | X | ○ | ○ |
| (d) | water swelling ratio (water resistance) (%) *3 | 1.0 | 0.9 | 1.1 | 1.1 | 1.0 | 1.5 | 1.1 | 1.5 |
| (e) | print wear characteristics *4 | ⊚ | ⊚ | ⊚ | ⊚ | ⊚ | X | ○ | X |
| (f) | plate wiping-off resistance | ○ | ○ | ○ | ○ | ○ | Evaluation omitted | ○ | X |
| Overall evaluation *5 | | ○ | ○ | ○ | ○ | ○ | X | X | X |

*1 Emulsifier: (i) means emulsifier (i) specified on page 20 of this specification.
*2 Developing time: 17 min/mm or less ⊚, less than 20 min/mm ○, and 20 min/mm or more X.
*3 Water swelling ratio when 1.3% or less was regarded as being acceptable.
*4 Abrasion loss: 7 mg/cm² or less ⊚, less than 10 mg/cm² ○, and 10 mg/cm² or more X.
*5 ○ means being acceptable with respect to all the evaluation items (a) to (f).

With respect to Examples 1, 10 and 11, it is also apparent from Table 3 that satisfactory results can be obtained in aqueous developer solution but also the print wear characteristics tended to drop.

TABLE 4

|  |  | Example 12 | Example 13 | Example 14 | Example 15 | Example 16 | Example 17 | Example 18 |
|---|---|---|---|---|---|---|---|---|
| (A) | Composition of hydrophilic copolymer (pts. wt.) | | | | | | | |
|  | (1) acrylic acid | 2 | 2 | 2 | 2 | 2 | 2 | 2 |
|  | (1) methacrylic acid | 5 | 5 | 5 | 5 | 5 | 5 | 5 |
|  | (2) butadiene | 60 | 60 | 60 | 60 | 60 | 60 | 60 |
|  | (3) styrene | 10 | 10 | 10 | 10 | 10 | 9.7 | 10 |
|  | (4) butyl acrylate | 23 | 23 | 23 | 23 | 23 | 23 | 23 |

TABLE 4-continued

|  | Example 12 | Example 13 | Example 14 | Example 15 | Example 16 | Example 17 | Example 18 |
|---|---|---|---|---|---|---|---|
| divinylbenzene |  |  |  |  |  | 0.3 |  |
| Total amt. of emulsifier (emulsifier: (i) *1) | 4 | 4 | 4 | 4 | 4 | 4 | 4 |
| t-Dodecylmercaptan | 1.6 | 1.7 | 1.9 | 2.4 | 1.7 | 2.4 | 3.3 |
| Emulsion polymn. temp. (° C.) | 60 | 70 | 80 | 100 | 80 | 80 | 80 |
| No. av. particle diam. of copolymer (A) (nm) | 62 | 59 | 47 | 42 | 43 | 44 | 45 |
| Toluene gel ratio (%) | 89 | 89 | 90 | 91 | 92 | 89 | 75 |
| Evaluation |  |  |  |  |  |  |  |
| (a) compatibility (dispersibility) | ○ | ○ | ○ | ○ | ○ | ○ | ○ |
| (b) developability with aqueous developer solution *2 | ○ | ⊚ | ⊚ | ⊚ | ⊚ | ⊚ | ○ |
| (c) image reproducibility | ○ | ○ | ○ | ○ | ○ | ○ | ○ |
| (d) water swelling ratio (water resistance) (%) *3 | 1.2 | 1.0 | 1.0 | 1.2 | 1.1 | 0.9 | 1.2 |
| (e) print wear characteristics *4 | ⊚ | ⊚ | ⊚ | ⊚ | ⊚ | ⊚ | ○ |
| (f) plate wiping-off resistance | ○ | ○ | ○ | ○ | ○ | ○ | ○ |
| Overall evaluation *5 | ○ | ○ | ○ | ○ | ○ | ○ | ○ |

*1 Emulsifier: (i) means emulsifier (i) specified on page 20 of this specification.
*2 Developing time: 17 min/mm or less ⊚, less than 20 min/mm ○, and 20 min/mm or more X.
*3 Water swelling ratio when 1.3% or less was regarded as being acceptable.
*4 Abrasion loss: 7 mg/cm$^2$ or less ⊚, less than 10 mg/cm$^2$ ○, and 10 mg/cm$^2$ or more X.
*5 ○ means being acceptable with respect to all the evaluation items (a) to (f).

A summary of the evaluation test results of resin compositions and printing plates obtained in Examples 19 to 24 are listed in Table 5.

Table 5 shows that satisfactory performance can be obtained with various reactive emulsifiers, amounts, particle diameters, etc. without exception.

INDUSTRIAL APPLICABILITY

When the photosensitive resin composition for flexographic printing according to the present invention is employed, the compatibility (dispersibility) of hydrophilic and hydrophobic components of the photosensitive resin

TABLE 5

|  | Example 19 | Example 20 | Example 21 | Example 22 | Example 23 | Example 24 |
|---|---|---|---|---|---|---|
| (A) Composition of hydrophilic copolymer (pts. wt.) |  |  |  |  |  |  |
| (1) acrylic acid | 2 | 2 | 2 | 2 | 2 | 2 |
| (1) methacrylic acid | 5 | 5 | 5 | 5 | 5 | 5 |
| (2) butadiene | 60 | 60 | 60 | 60 | 60 | 60 |
| (3) styrene | 10 | 10 | 10 | 10 | 10 | 10 |
| (4) butyl acrylate | 23 | 23 | 23 | 23 | 23 | 23 |
| Reactive emulsifier *1 | (i) | (i) | (ii) | (iii) | (i) | (i) |
| Total amt. of reactive emulsifier (pts. wt.) | 2 | 4 | 4 | 4 | 15 | 4 |
| Nonreactive emulsifier species |  |  |  |  |  | *B |
| Total amt. of nonreactive emulsifier (pts. wt.) | 0.0 | 0.0 | 0.0 | 0.0 | 0.0 | 0.5 |
| t-Dodecylmercaptan | 2.0 | 2.0 | 2.0 | 2.0 | 2.3 | 2.0 |
| Emulsion polymn. temp. (° C.) | 80 | 80 | 80 | 80 | 80 | 80 |
| No. av. particle diam. of copolymer (A) (nm) | 80 | 55 | 52 | 51 | 15 | 58 |
| Toluene gel ratio (%) | 87 | 90 | 90 | 90 | 91 | 89 |
| Evaluation |  |  |  |  |  |  |
| (a) compatibility (dispersibility) | ○ | ○ | ○ | ○ | ○ | ○ |
| (b) developability with aqueous developer solution *2 | ⊚ | ⊚ | ⊚ | ⊚ | ⊚ | ⊚ |
| (c) image reproducibility | ○ | ○ | ○ | ○ | ○ | ○ |
| (d) water swelling ratio (water resistance) (%) *3 | 1.0 | 1.0 | 1.0 | 1.0 | 1.2 | 1.2 |
| (e) print wear characteristics *4 | ⊚ | ⊚ | ⊚ | ⊚ | ⊚ | ○ |
| (f) plate wiping-off resistance | ○ | ○ | ○ | ○ | ○ | ○ |
| Overall evaluation *5 | ○ | ○ | ○ | ○ | ○ | ○ |

*1 Emulsifiers (i) to (iii) refer to emulsifiers (i) to (iii) specified on pages 20–21 of this specification, respectively.
*B Nonreactive emulsifier: sodium (dodecyl diphenyl ether) disulfonate.
*2 Developing time: 17 min/mm or less ⊚, less than 20 min/mm ○, and 20 min/mm or more X.
*3 Water swelling ratio when 1.3% or less was regarded as being acceptable.
*4 Abrasion loss: 7 mg/cm$^2$ or less ⊚, less than 10 mg/cm$^2$ ○, and 10 mg/cm$^2$ or more X.
*5 ○ means being acceptable with respect to all the evaluation items (a) to (f).

composition can be enhanced; and developing time with an aqueous developer solution can be shortened. Furthermore, there can be obtained the printing plate characterized in that the resistance to water base ink is high; that the image reproducibility is excellent; that high print wear characteristics can be maintained even when a water base ink is adhered; and that the plate wiping-off resistance in removing the ink adhered to the printing plate is high.

What is claimed is:

1. A photosensitive resin composition for flexographic printing comprising:
   (A) a hydrophilic copolymer,
   (B) a thermoplastic elastomer,
   (C) a photopolymerizable unsaturated monomer, and
   (D) a photopolymerization initiator, wherein the hydrophilic copolymer (A) is a polymer obtained by copolymerizing at least:
   (1) 2 to 15 parts by mass of an unsaturated monomer having a carboxyl group,
   (2) 50 to 80 parts by mass of a conjugated diene monomer,
   (3) 3 to 20 parts by mass of an aromatic vinyl compound, and
   (4) 3 to 30 parts by mass of an alkyl (meth)acrylate, per 100 parts by mass of unsaturated monomers for use in the copolymerization,
   wherein the hydrophilic copolymer (A) has a gel ratio, as measured with toluene, of 80 to 95%.

2. The photosensitive resin composition for flexographic printing according to claim 1, wherein the hydrophilic copolymer (A) is one synthesized by emulsion polymerization and the polymerization temperature is 60° C. or higher.

3. The photosensitive resin composition for flexographic printing according to claim 2, wherein the polymerization temperature is 70° C. or higher.

4. The photosensitive resin composition for flexographic printing according to any one of claims 1 to 3, wherein the hydrophilic copolymer (A) is a polymer obtained by copolymerizing at least:
   (1) 2 to 15 parts by mass of the unsaturated monomer having a carboxyl group,
   (2) 50 to 80 parts by mass of the conjugated diene monomer,
   (3) 3 to 20 parts by mass of the aromatic vinyl compound, and
   (4) 3 to 30 parts by mass of the alkyl (meth)acrylate, and further 0.5 part by mass or less of a polyfunctional vinyl compound, per 100 parts by mass of unsaturated monomers for use in the copolymerization.

5. A photosensitive resin composition for flexographic printing comprising:
   (A) a hydrophilic copolymer,
   (B) a thermoplastic elastomer,
   (C) a photopolymerizable unsaturated monomer, and
   (D) a photopolymerization initiator, wherein the hydrophilic copolymer (A) is a polymer obtained by copolymerizing at least:
   (1) 2 to 15 parts by mass of an unsaturated monomer having a carboxyl group,
   (2) 50 to 80 parts by mass of a conjugated diene monomer,
   (3) 3 to 20 parts by mass of an aromatic vinyl compound, and
   (4) 3 to 30 parts by mass of an alkyl (meth)acrylate, per 100 parts by mass of unsaturated monomers for use in the copolymerization,
   wherein the hydrophilic copolymer (A) has a number average particle diameter ranging from 5 to 100 nm.

6. The photosensitive resin composition for flexographic printing according to any one of claims 1, 2, 3, and 5, wherein an emulsifier used in emulsion copolymerization of the hydrophilic copolymer (A) comprises a nonreactive emulsifier in an amount of less than 1 part by mass and an reactive emulsifier in an amount of 1 to 20 parts by mass, per 100 parts by mass of the hydrophilic copolymer.

7. The photosensitive resin composition for flexographic printing according to claim 6, wherein the reactive emulsifier contains a polyoxyalkylene structure.

8. A photosensitive structure for flexographic printing, comprising a laminate structure comprising a support and a layer of the photosensitive resin composition according to any one of claims 1, 2, 3 and 5 formed on a surface of the support.

* * * * *